United States Patent
Sun et al.

(10) Patent No.: US 6,924,230 B2
(45) Date of Patent: Aug. 2, 2005

(54) METHOD FOR FORMING A CONDUCTIVE LAYER

(75) Inventors: Yu-Chang Sun, Sindian (TW); Ching-Hsuan Tang, Taichung (TW); Chi-Shen Lee, Hsinchu (TW); Chai-Yuan Sheu, Tainan (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 10/653,080

(22) Filed: Sep. 3, 2003

(65) Prior Publication Data

US 2004/0253815 A1 Dec. 16, 2004

(30) Foreign Application Priority Data

Jun. 11, 2003 (TW) .......................................... 92115887

(51) Int. Cl.⁷ .......................................... H01L 21/4763
(52) U.S. Cl. ...................... 438/640; 438/701; 438/700; 438/689; 438/948; 438/952; 430/299; 430/315; 430/15; 430/317
(58) Field of Search ................................ 438/640, 701, 438/700, 689, 948, 952, 299, 317, 323, 324, 30, 622, 158; 430/299, 315, 15, 317, 323, 324

(56) References Cited

U.S. PATENT DOCUMENTS

| | | | | |
|---|---|---|---|---|
| 4,824,767 A | * | 4/1989 | Chambers et al. | 430/313 |
| 4,871,651 A | * | 10/1989 | McCune et al. | 430/315 |
| 5,017,459 A | * | 5/1991 | McColgin | 430/299 |
| 5,324,671 A | * | 6/1994 | Bayraktaroglu | 438/170 |
| 5,766,808 A | * | 6/1998 | Linde et al. | 430/15 |
| 6,444,484 B1 | * | 9/2002 | Ahn | 438/30 |
| 6,489,227 B1 | * | 12/2002 | Hsieh et al. | 438/601 |

* cited by examiner

Primary Examiner—David Zarneke
Assistant Examiner—Victor V. Yevsikov
(74) Attorney, Agent, or Firm—Bacon & Thomas

(57) ABSTRACT

A method for forming a conductive layer is disclosed, which has the following steps. First, a substrate is provided, and then a patterned photoresist layer having an undercut is formed on the substrate. After that, at least one conductive layer is deposited on the substrate. Finally, the patterned photoresist layer is lifted off; wherein the shape of the conductive layer remaining on the substrate is complementary to that of the patterned photoresist layer.

1 Claim, 3 Drawing Sheets

METHOD FOR FORMING A CONDUCTIVE LAYER

BACKGROUND OF THE INVENTION

1. Field of the Invention

The present invention relates to a method for forming a conductive layer and, more particularly, to a method for forming a gate electrode or a metal line of a transistor in manufacturing a thin film transistor liquid crystal display (TFT-LCD).

2. Description of Related Art

For the manufacturing of a thin film transistor array, it is critical to control well the taper angle of a film because the tapers may affect the step-coverage of subsequently deposited films, the formation of voids, and the yield of TFT-LCDs.

The manufacturing of a TFT array mainly includes the steps of thin film deposition, photo-lithography, and etching, etc. for forming patterned conductive lines or gate electrodes. Currently, the taper angle is generally adjusted through regulating the parameters of the etching process, for example, use of particular etchant or gas to obtain a desired taper angle. Unfortunately, the taper angle formed by etching process usually cannot be controlled sufficiently to remain within the specification limits.

In recent years, in order to minimize the RC-delay, the materials with low electrical resistance, such as Al or Cu are increasingly used for forming metal lines of a TFT-LCD. Moreover, the multilayer structures are utilized to overcome the application limitation of Al and Cu as they can enhance the adhesion, reduce spiking issues, and avoid inter-layer diffusion. However, the difficulty of the etching step is consequently increased. As shown in FIGS. 1A and 1B, a multilayer metal structure, (for example, a metal structure of Ti/Cu/Ti) is formed on the surface of substrate 210. After being etched, the width of each layer is different from each other because each layer made of different materials has different etching rates. As shown in FIG. 1A, the middle layer 230 of the multilayer metal structure has a faster etching rate than the top and bottom layers so that the multilayer metal structure shrinks at its middle part after being etched. On the other hand, as shown in FIG. 1B, the middle layer 230 of the multilayer metal structure has a slower etching rate than the top and bottom layers so that the multilayer metal structure shrinks at its peripheral parts. Both the conditions mentioned above result in bad step coverage and occurrence of voids 250 during subsequent film deposition, such as deposition of a protecting layer 240. Although the issue of different etching rates does not happen in the single layer structure, the poor controlling of the etching process often causes a short circuit of metal lines and leads to inefficiency of devices. Furthermore, the operation channel may also be damaged during the etching process.

If the taper angle is defined as the included angle between the surfaces of deposited film and the substrate, it is usually larger than 60° after the deposited film has undergone the photolithography and etching processes in the prior art. However, the method for forming a conductive film of the present invention can form patterned conductive lines or a gate electrode that has a taper angle less than 60° when using photolithography, thin film deposition, and lifting-off of a photoresist. Consequently, a conductive film having a profile better than that of prior art is obtained, which increases the step-coverage of subsequent thin film deposition, reduces the occurrence of voids, simplifies the processing procedures, lowers the difficulty of processing, avoids the complex etching process, and achieves both high productivity and high yield.

SUMMARY OF THE INVENTION

The object of the present invention is to provide a method for forming a conductive layer so that a deposited film with a taper is formed after a photolithography process. As a result, the step-coverage of a subsequently deposited multiplayer structure is improved, and the interlayer voids are minimized. Moreover, because the complex etching process is eliminated, the method for forming a conductive film of the present invention is free from the problem of a diverse etching rate, and can effectively avoid the short of metal lines and the damage of an operation channel. Therefore, the processing procedures are simplified, the cost is lowered, and the market competitiveness is increased.

To achieve the object, the method for forming a conductive layer of the present invention includes the following steps. First, a substrate is provided, and then a patterned photoresist layer having an undercut is formed on the substrate. After that, at least one conductive layer is deposited on the substrate. Finally, the patterned photoresist layer is lifted off; wherein the shape of the conductive layer remaining on the substrate is complementary to that of the patterned photoresist layer.

The method for forming a conductive layer of the present invention comprises providing a substrate, which has a surface made of glass, silica nitride, silica oxide, amorphous silicon, crystalline silicon, doped silicon, metals, metallic nitrides, metallic nitride silicides, polymers, or organic light-emitting materials. The patterned photoresist layer having an undercut is formed through the adjustment of the thickness and composition of the photoresist, the exposure energy, the depth of focus, the temperature of baking, and the time for developing. Preferably, the patterned photoresist layer has a cross-section of an inverted trapezoid, T-shape, or mushroom shape, and is not restricted to a positive photoresist or a negative photoresist. The conductive layer is deposited by physical vapor deposition (PVD), evaporation, low-pressure chemical vapor deposition, or plasma enhanced chemical vapor deposition, and may be a multilayer structure or single layer. The multilayer structure may be constructed of a barrier layer (or a glue layer), a conductive layer, and a barrier layer (or a glue layer). Preferably, the multilayer structure is Ti/Al/Ti, Ti/Al/TiN, Ti/Cu/Ti, Cr/Cu/Cr, W/Cu/W, MoN/Al/MoN, Mo/Al—Nd alloy, MoN/Al—Nd alloy, Mo/Al—Nd alloy/Mo, Ta/Cu/Ta, TaN/Cu/TaN, TiN/Cu/TiN, Ti/Al, or Mo/Al/Mo. The single layer may be Cr, Cu, Al—Nd alloy, Mo—W alloy, or Al. Preferably, the conductive layer deposited on the photoresist layer is not connected to the conductive layer deposited on the substrate. Finally, the patterned photoresist is lifted-off to leave the conductive layer that has a complementary shape with the patterned photoresist layer on the substrate. Optionally, the method for forming a conductive layer of the present invention can further comprise a step of depositing a protecting layer or an interlayer dielectric layer after lifting off the patterned photoresist layer.

The present invention forms a patterned photoresist having an undercut by adjusting the parameters of the photolithography process. Due to the shield of the photoresist, the film deposited at the periphery of the photoresist is thinner and therefore a taper angle less than 60° is formed at the edge of the film after the thin film deposition process. The method of the present invention is simple and can be applied to even more complex processes, such as the construction of a multilayer structure. The field of the method for forming a conductive layer of the present invention is not restricted. Preferably, the method is applied to the formation of the gate electrode or metal lines of a thin film transistor in the manufacturing of a TFT-LCD. Similarly, the method may also form the metallic conducting wires of semiconductors.

Other objects, advantages, and novel features of the invention will become more apparent from the following detailed description when taken in conjunction with the accompanying drawings.

DETAILED DESCRIPTION OF THE PREFERRED EMBODIMENT

EXAMPLE 1

Figure 1A:
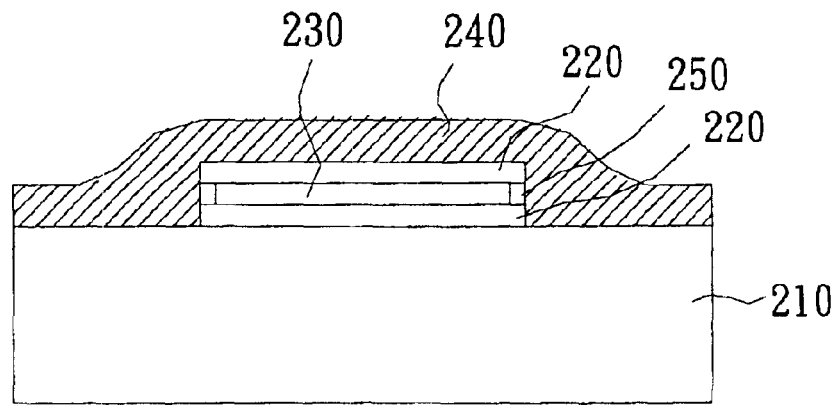
FIGS. 1A and 1B are perspective views of profiles of a conductive film after being etched in the prior art.
Figure 1B:
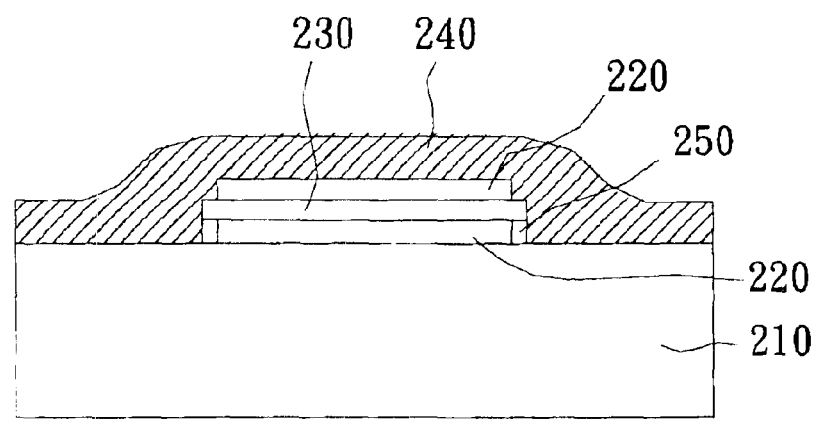
Figure 2:
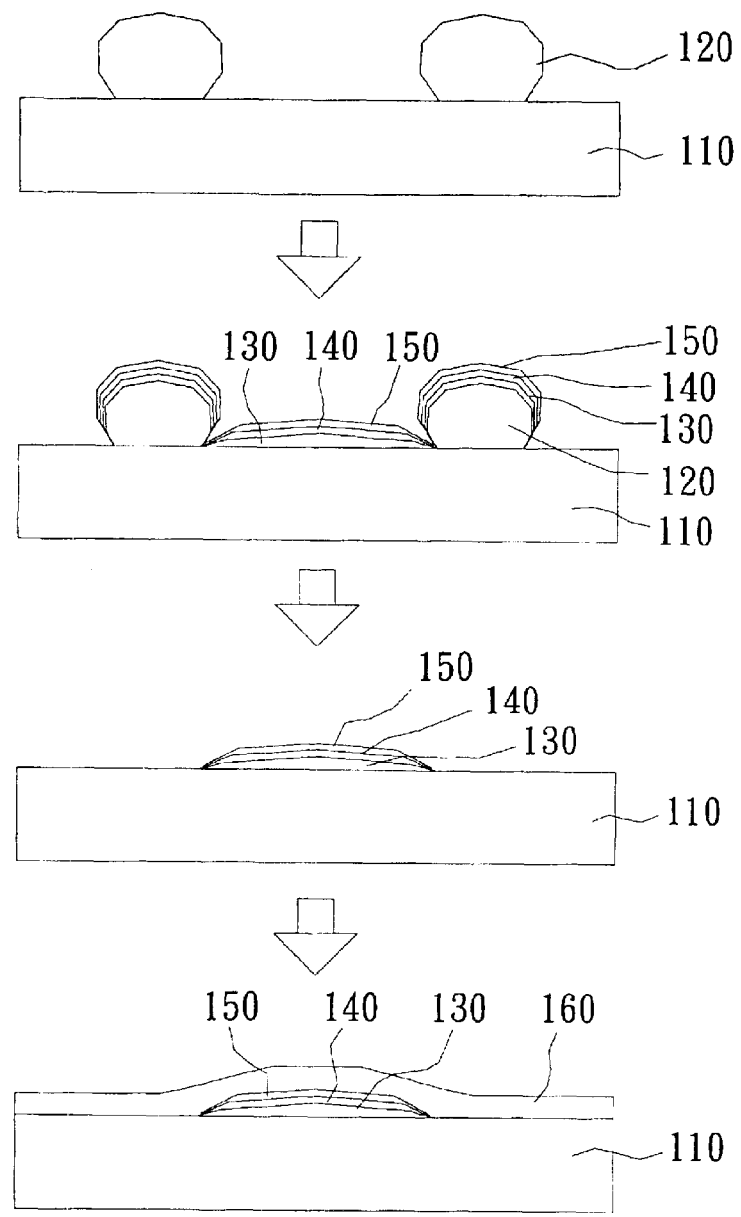
FIG. 2 is a perspective view of the method of a preferred embodiment of the present invention.

With reference to FIG. 2, there is shown a perspective view of the method of a preferred embodiment of the present invention. First, a substrate 110 is provided, wherein the surface of substrate 110 is made of glass, silica nitride, silica oxide, amorphous silicon, crystalline silicon, doped silicon, metals, metal nitrides, polymers, or organic light-emitting materials. Then, a photoresist layer is formed on the substrate 110, which is subsequently baked, exposed, and developed to form a patterned photoresist layer 120 thereon; wherein the parameters of the photolithography process, such as the thickness or composition of the photoresist, the energy of exposure, the depth of focus, the temperature of baking, or the time for developing are adjusted to form the patterned photoresist layer 120 having an undercut. Preferably, the patterned photoresist layer 120 has a cross section of a mushroom shape and is made of a negative photoresist. After that, a multilayer metal composed of metal layers 130, 140, and 150 is deposited by PVD, evaporation, LPCVD, or PECVD. The metal layers 130 and 150 may be made of the same materials. For example, the multilayer metal is composed of Ti/Al/Ti, Ti/Al/TiN, Ti/Cu/Ti, Cr/Cu/Cr, W/Cu/W, Mo/W, MoN/Al/MoN, TaN/Cu/TaN, TiN/Cu/TiN, or Mo/Al/Mo. The metal layers 130, 140, and 150 deposited on the photoresist layer 120 are not connected to the metal layers 130, 140, and 150 deposited on the substrate 110. Afterwards, the patterned photoresist layer 120 is lifted-off to leave the multilayer metal that has a shape complementary with the patterned photoresist layer 120 on the substrate. Finally, a protecting layer or an interlayer dielectric layer 160 is formed on the substrate 110 for protecting the multilayer metal or for further processing.

The present invention forms a patterned photoresist having an undercut by adjusting the parameters of photolithography process. Due to the shield of the photoresist, the multilayer metal deposited at the periphery of the photoresist is thin and therefore a taper angle less than 60° is formed at the edge of the film. As a result, the step-coverage of subsequently deposited film is improved. The method is simple and free from the problems, such as the diverse etching rate encountered in etching. Furthermore, the interlayer voids are minimized and the yield and productivity are increased relative to the prior art.

EXAMPLE 2

Figure 3:
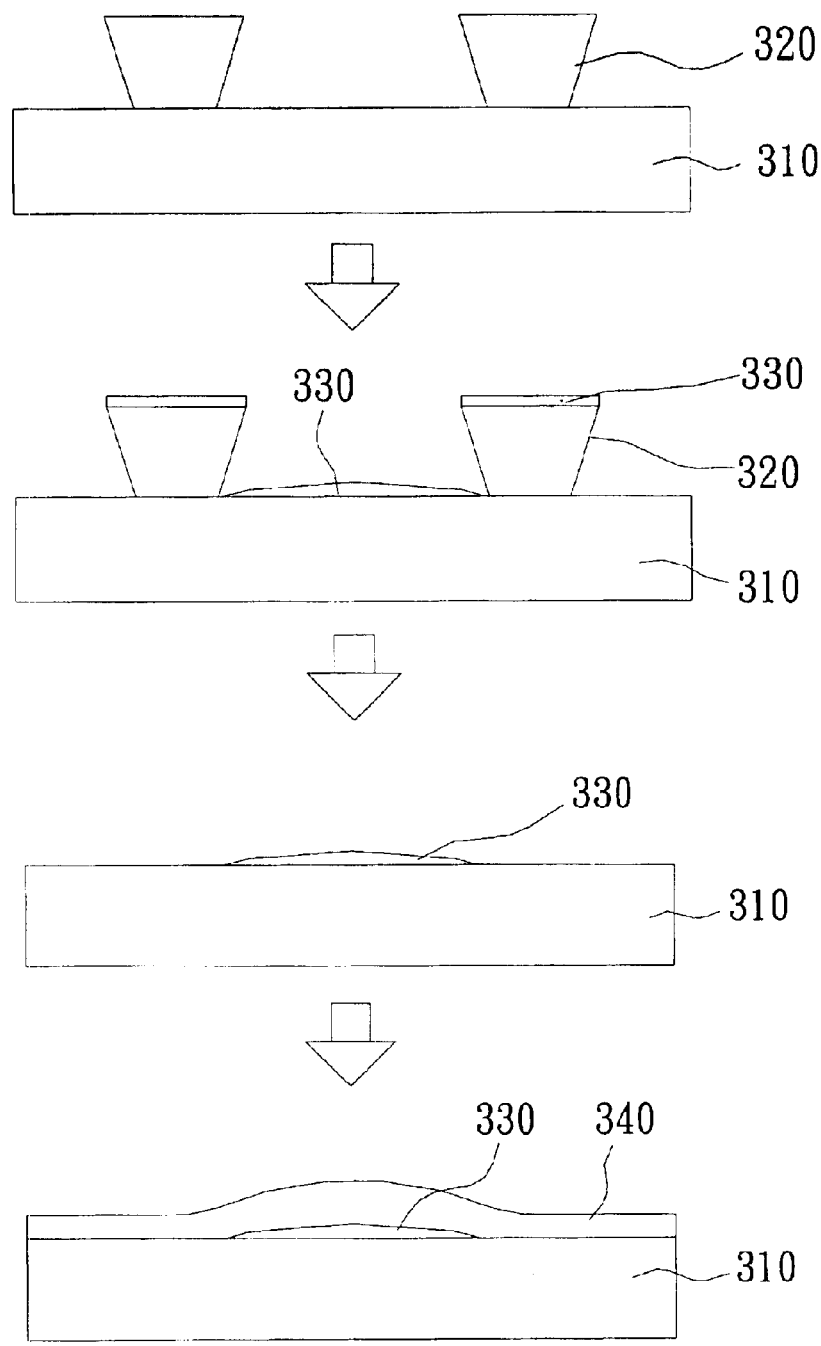
FIG. 3 is a perspective view of the method of another preferred embodiment of the present invention.

With reference to FIG. 3, there is shown a perspective view of the method of another preferred embodiment of the present invention. With reference to FIG. 3, there is shown a perspective view of the method of another preferred embodiment of the present invention. First, a substrate 310 is provided, wherein the surface of substrate 310 is made of glass, silica nitride, silica oxide, amorphous silicon, crystalline silicon, doped silicon, metals, metal nitrides, polymers, or organic light-emitting materials. Then, a photoresist layer is formed on the substrate 310, which is subsequently baked, exposed, and developed to form a patterned photoresist layer 320 thereon; wherein the parameters of photolithography process, such as the thickness or composition of the photoresist, the energy of exposure, the depth of focus, the temperature of baking, or the time for developing are adjusted to form the patterned photoresist layer 320 having an undercut. Preferably, the patterned photoresist layer 320 has a cross section of an inverted trapezoid shape and is made of a negative photoresist. After that, a single metal layer 330, such as Cr, Cu, or Al layer is deposited by PVD, evaporation, LPCVD, or PECVD. The single metal layer 330 deposited on the photoresist layer 320 is not connected to the single metal layers 330 deposited on the substrate 310. Afterwards, the patterned photoresist layer 320 is lifted-off to leave the single metal layer 330 that has a shape complementary with the patterned photoresist layer 320 on the substrate 310. Finally, a protecting layer or an interlayer dielectric layer 340 is formed on the substrate 310 for protecting the single metal layer or for further processing.

The present invention forms a patterned photoresist having an undercut by adjusting the parameters of photolithography process. Due to the shield of the photoresist, the single metal player 330 deposited at the periphery of the photoresist is thin and therefore a taper angle less than 60° is formed at the edge of the film. As a result, a conductive layer having a good profile is obtained so that the step-coverage of a subsequently deposited film is good and the interlayer voids are minimized. At the same time, the channel of device will not be damaged in the etching step. For example, the source electrode and drain electrode will not be over-etched and thus formation of pits is avoided. The method is simple, easy, and free from the problems of the complex etching step. Furthermore, both the yield and productivity are high.

Although the present invention has been explained in relation to its preferred embodiment, it is to be understood that many other possible modifications and variations can be made without departing from the spirit and scope of the invention as hereinafter claimed.

What is claimed is:

1. A method for forming a conductive layer comprising:

(A) providing a substrate;

(B) forming a patterned single-layered photoresist having an undercut on said substrate;

(C) depositing at least one conductive layer on said substrate; and (D) lifting off said patterned photoresist layer; wherein the remained conductive layer takes the shape of the lifted photoresist layer accordingly;

wherein an edge of said conductive layer forms a taper, which is less than 60° and is defined by the surfaces of said conductive layer and said substrate.

* * * * *